United States Patent Office 3,307,119

Patented Feb. 28, 1967

3,307,119

FREQUENCY MODULATOR HAVING TWO VARACTOR DIODE OSCILLATORS, ONE WEAKLY COUPLED, THE OTHER STRONGLY COUPLED, TO THE MIXING STAGE

Herbert Holzwarth, Stockdorf, Hans Leysieffer, Munich-Solln, and Egmont Gabler, Munich, Germany, assignors to Siemens & Halske Aktiengesellschaft Berlin and Munich, a corporation of Germany Filed May 1, 1963, Ser. No. 277,979
Claims priority, application Germany, May 4, 1962, S 79,299
6 Claims. (Cl. 332—18)

Figure 1:
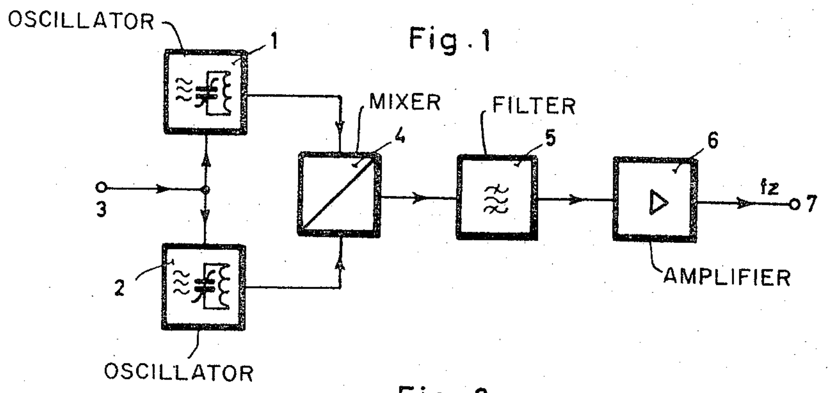

The invention disclosed herein relates to a frequently modulator and is particularly concerned with a modulation circuit for producing highly linear frequency modulated electromagnetic waves.

Frequency modulators are required, for example, for wideband directional wireless systems operating with frequency modulation. The requirements as to linearity of the frequency modulation circuit are in such cases very high. These requirements were until now met by altering, in the beat of the modulation, the frequency of the microwave oscillation produced in a reflex klystron, directly by alteration of the reflector voltage. The relative frequency displacement effected in such modulators, is relatively slight, owing to the very high fundamental frequency of the reflex klystron, so that the required linearity is obtained. Another known method of producing for these purposes a wideband frequency modulation resides in effecting, at a relatively high frequency, a frequency modulation with corresponding displacement, and placing the modulated signal by means of a frequency transformer in a relatively low intermediate frequency position. The absolute frequency displacement in the intermediate frequency position is thereby equal to the frequency displacement in the relatively high position. The frequency modulated oscillation of the intermediate frequency position is thereupon, by frequency multiplication or frequency transformation, brought into the electrical oscillation of the desired initial frequency position. While these known circuits operate relatively satisfactorily, they entail very great expenditude, which is primarily due to the very high requirements with respect to the frequency constancy of the individual oscillators.

The object underlying the invention is to improve a frequency modulation circuit primarily in such a manner, as compared with customary circuits, that the oscillator devices and amplifier devices, operating in the range of microwaves, can be omitted in the modulation part and that problems having to do with frequency constancy and linearity do not arise incident to changing tubes. Moreover, the volume shall be small and a requirement which is as a rule difficult to meet, shall be satisfied, namely, the operating temperatures, operating voltages and power consumption, shall be held low.

According to the invention, these objects are realized in connection with a modulation circuit for producing highly linear frequency modulated electromagnetic waves, by the provision of two oscillators which are as to frequency, in the beat of a modulation, alterable in opposite sense, by means of at least one varactor diode disposed in parallel to the frequency determining resonance circuit of the respective oscillator, said oscillators operating in the absence of modulation with frequencies which differ to such an extent that the resulting frequency difference corresponds to a predetermined intermediate frequency value in the range of lower frequencies, the output of each of the two oscillators being connected with a mixing stage in the output of which is provided a filter circuit for obtaining the oscillations with difference frequency.

A frequency transformer is advantageously connected with the filter circuit, for transposing the output frequency of the filter circuit into the frequency range provided for the transmission, especially into the microwave range.

It is also advantageous to connect in parallel with each of the two frequency determining resonance circuits, the series circuit formed by two oppositely poled varactor diodes, to pole the two series circuits mutually differently, and to connect the modulation voltage source with both series circuits in the same phase. A likewise advantageous alternative arrangement is obtained by connecting parallel to each of the two frequency determining resonance circuits, the series circuit formed by two oppositely poled varactor diodes, to pole the series circuits mutually identically, and to connect the modulation voltage source with both series circuits in opposing phase.

It is further advantageous to provide a frequency regulation or control device which preferably operates at the frequency of the filter circuit and delivers a regulation voltage corresponding to the frequency supplied, a frequency control device being preferably provided only for one of the two oscillators, such frequency control device being operable, by means of the regulation voltage, to correctively regulate the output frequency at least nearly to its desired value.

It was found particularly advantageous to strongly couple one of the two oscillators with the mixing stage while weakly coupling the other oscillator therewith, and to make the level of the weakly coupled oscillator so high, at the input of the mixing stage, that the level of the modulation signal is after demodulation of the modulated waves, considerably higher, preferably from 60 to 80 decibels higher than the noise level, referred to the frequency band width of a customary telephone channel, caused by the amplifier following the mixing stage. The weakly coupled oscillator is advantageously connected with the mixing stage by way of a low pass filter with a limit frequency which lies but slightly above the corresponding fundamental frequency of the oscillator.

In order to hold noise products low, the absolute frequency displacement of the two oscillators is differently set, by different bias of the varactor diodes of the two oscillators and/or by different dimensioning of the ratios of inductance to capacitance of the two frequency determining resonance circuits, so that distortions of even number order are compensated at the output of the mixing stage. An advantageous embodiment for the solution of this problem resides in making the coupling of the mixing stage at each of the two oscillators frequency-dependent, such that distortions of third order are for each oscillator reduced to a negligibly low value.

Further objects and features of the invention will appear in the course of the description of embodiments which is rendered below with reference to the drawings.

Figure 2:
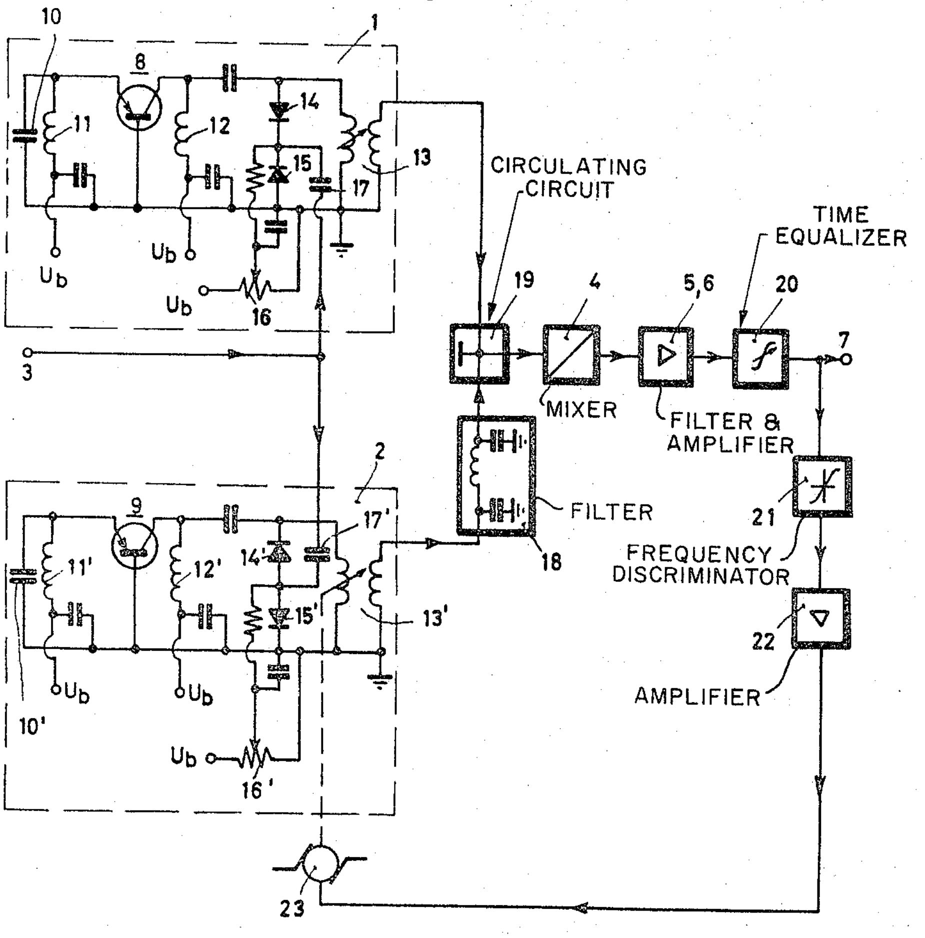
Figure 3:
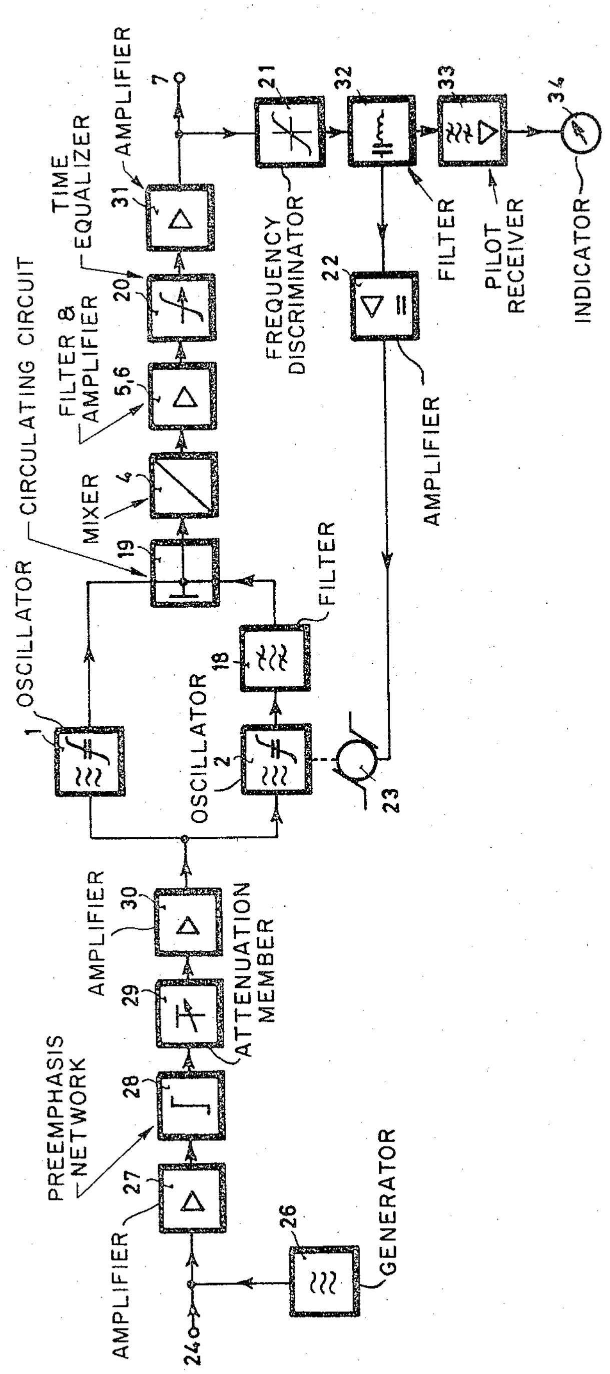

FIG. 1 indicates an embodiment comprising two freely oscillating transistor oscillators;

FIG. 2 shows an embodiment which is as to circuitry particularly advantageous; and FIG. 3 represents in block diagram manner an arrangement in which the total noises, referred to the transmission path, are held particularly low.

Referring now to FIG. 1, the modulation circuit shown has two freely oscillating transistor oscillators 1 and 2, operating in base circuit, the frequencies of which lie above a desired intermediate frequency value, for example, $f_1$ at 170 megacycles and $f_2$ at 240 megacycles, assuming that the intermediate frequency $f_z$ amounts to 70 megacycles. Both oscillator oscillations ($f_1$, $f_2$) are in a mixing stage 4 mixed and the difference oscillation is by way of a selective amplifier 5, 6, conducted to the modulator output 7. Both oscillators are as to the frequency variable, by means of varactor diodes which act as variable capacitances. These diodes are circuited so that, at a given signal voltage at the modulation input 3, the frequency of one oscillator deviates toward higher frequencies and the frequency of the other oscillator toward lower frequencies, and vice versa. The effect is that the output oscillation of the modulator is in desired manner frequency modulated. The obtained absolute frequency displacement is equal to the sum of the absolute frequency displacement of the oscillators. The circuit makes it in advantageously simple manner possible to compensate the distortion parts of even order, which are produced by the non-linear relationship between the input voltage and frequency deviation in each of the two oscillators. Moreover, a further advantage of the modulation circuit according to the invention resides in that deviations of the center frequency of the individual oscillators, caused by the non-linearity, are compensated in the intermediate frequency plane.

In FIG. 2, showing a particularly advantageous embodiment so far as circuitry is concerned, each of the two oscillators, represented within dash line rectangles 1 and 2, comprises a transistor respectively indicated by numerals 8 and 9, operating in base circuit. In the emitter lead of the transistor 8 is connected a reactance including a capacitance 10 and a choke 11 over which is extended an operating voltage, and in the emitter lead of the transistor 9 is similarly connected a reactance including a capacitance 10' and a voltage input choke 11', such reactances adapting the respective emitter-base circuits for the desired operating frequency. The collector voltage for the individual transistor is likewise extended over a choke indicated respectively by numerals 12, 12'. The frequency determining resonance circuit is capacitively connected to the respective choke 12, 12', the corresponding resonance circuit comprising the inductance of a tunable output transformer 13 and 13' and parallel thereto the capacitance of the series circuit of two varactor diodes respectively indicated by numerals 14, 15 and 14', 15'.

It is important for the series circuit, that the varactor diodes are within the respective series circuit oppositely poled. A constant bias with adjustable value is over a voltage divided such as 16, 16' connected to the connecting point of the respective pairs of varactor diodes, and the modulation voltage is connected thereto by way of a coupling capacitor such as 17, 17'.

It will be seen from FIG. 2 that the two series circuits 14, 15 and 14', 15' of the two oscillators with their parallel connected varactor diodes, are oppositely poled. However, both series circuits receive the modulation voltage with identical phase. The output voltage of the respective oscillator is obtained at its output transformer 13, 13', respectively.

One of the oscillators, for example, oscillator 1 may operate with 240 megacycles and the other oscillator 2 with 170 megacycles. The output voltage, preferably from the oscillator 2 with low frequency, is conducted to the mixing stage 4 with a level which is considerably lower than the level of output voltage of the other oscillator 1. Moreover, a low pass filter 18 is inserted in the connection from the oscillator 2 to the mixing stage, such filter lying only slightly above the highest operating frequency of the respective oscillator so as to exclude from the mixing stage 4 harmonics of such oscillator. The feed-in of the two oscillator voltages to the mixing stage is effected by way of circulating circuit 19 of known kind, for example, a directional coupler which assures a decoupling of the two oscillators 1 and 2, in the measure required to suppress all further side wave products.

According to another advantageous embodiment of the circuit according to the invention, the circulator circuit 19 is omitted and in the line from the oscillator which is to be weakly coupled with the mixing stage, is in addition to the low pass filter 18 connected an attenuation line with a transmission attenuation of, for example, 15–20 decibels. To the output of the mixing stage 4 is connected a frequency selective amplifier 5, 6, also shown in FIG. 1.

Investigations have shown that distortions occurring in the modulation circuit are advantageously compensated possibly directly at the place where they appear, and there is therefore inserted in the corresponding line a time equalizer 20 which compensates the running time distortions occurring in the modulation circuit. Such time equalizers are generally known and an example of a time equalizer is disclosed in the proceedings of I.E.E., part IIIA, volume 99, 1952, No. 18, pages 427–435.

A part of the output energy is branched off at the output 7 at which is obtained the desired frequency modulated oscillation in the intermediate frequency position, and the branched off part is conducted over a frequency discriminator 21, which is as linear as possible, to a direct voltage amplifier 22 which controls a corrective adjustment device 23 for one of the oscillators, in the illustrated example, the oscillator 2 with the lower frequency, the corrective adjustment being such that the center frequency corresponds in the intermediate frequency position to a predetermined value. It is moreover important that a low pass filter is included in the output of the discriminator, for effectively suppressing the modulation frequencies and primarily the low frequencies. The corrective frequency adjustment motor 23, as provided in this embodiment, likewise acts in a sense as a low pass filter of this kind.

Another possibility for the parallel circuit, at least the analog or equivalence-like parallel circuit of the varactor diodes for the frequency determining resonance circuit of the individual oscillator, resides in similarly poling the two series circuits 14, 15 and 14', 15', and conducting the modulation voltage to the two series circuits in opposed phase. In such case, the modulation voltage is fed over a symmetry transformer or a circuit equivalent thereto, which supplies two oppositely poled output voltages.

The relation between the signal voltage and frequency deviation of the individual oscillator is demonstrably non-linear. This relation is described by an arcuate curve which, however, extends continuously in the working range, and can be comprehended in the form of a series extension. The circuit according to the invention provides nevertheless an increased linearity, owing to the fact that the distortions of even number order, which are caused by the curvature, are mutually cancelled out at the output of the superposing stage.

The quadratic part of the curvature causes in the individual oscillator, in the presence of a modulation signal, for example, the fundamental band signal, a shifting of the center frequency. This undesired effect can likewise be compensated in the intermediate frequency position, by adjustment to optimum linearity; the absolute center frequency deviations are then for both oscillators of the same magnitude and extend in identical direction.

The varactor diodes used should be selected so as to provide characteristic curves in the respective pairs which are as similar as possible. Nevertheless, the optimum as to linearity will not be obtained even when this is done. It must be considered in this connection that an adjustment of the bias for the respective varactor pairs, for example, over the voltage dividers 16, 16', to the identical value, will not effect compensation of the distortions because the individual distortion parts have a different absolute displacement owing to the different fundamental frequencies. The coefficients of the curvature parts depend upon the varactor bias, and it is therefore possible to obtain with the aid of different bias, a compensation of the distortions (and therewith also the center deviations). Accordingly, it is for optimum linearity required to provide appropriately different bias for the two series circuits. The further requirement according to which the center frequencies of the two oscillators must differ by the amount of the intermediate frequency, can be satisfied by appropriate selection of the oscillation circuit inductances.

The frequency constancy of freely oscillating oscillators should be as a rule sufficient, provided that the requirements are not too high; a corrective frequency adjustment can, however, be provided to satisfy higher requirements. For example, as shown in FIG. 2, a small part of the intermediate frequency output power can be branched off for a discriminator 21 operating at the intermediate frequency and followed by the amplifier 22. The obtained criterion can be utilized, for example, with the aid of a motor control 23, to affect the inductance of one of the oscillator circuits in the sense of a corrective frequency regulation. While corrective adjustment of both oscillators as well as an electrical regulation, for example, by controlled premagnetization, are feasible, such adjustments will be necessary only in the presence of very high requirements.

It was found advantageous, upon using the frequency modulation circuit according to the invention, in connection with the sender of a directional wireless system or a wave guide transmission system operating in the range of microwaves, to provide for cooperation with the modulation circuit further groups of circuits which make it possible to hold the total noises, referred to the entire transmission path, particularly low. An arrangement which has been found particularly advantageous for this purpose, is shown in block diagram manner in FIG. 3.

Referring to FIG. 3, signal oscillations (fundamental band) are extended over the terminal 24, such oscillations encompassing a frequency range from about 10 cycles up to about 8 megacycles or higher. This fundamental band is amplified in a first wideband amplifier 27, after first adding thereto a pilot oscillation from a generator 26, the frequency of which lies above the fundamental or basic band or in a frequency gap within the basic band. The basic band may, for example, contain a great number of telephone channels; according to present-day requirements, there may be considered about 1800 telephone channels and likewise a television channel. In order to obtain a favorable noise balance even in the case of a very long radio transmission or wave guide transmission path, there is provided serially of the wideband amplifier 27, a quadripole 28 (preemphasis network) with frequency dependent attenuation. This quadripole 28 is followed by an attenuation member which is regulatable in the transmission attenuation, with the aid of which can be adjusted the basic or fundamental band amplitude. Serially connected with the attenuation member 29 is a further wideband amplifier 30 over which is extended the modulation voltage to the modulation circuit proper. Accordingly, the attenuation member 29 makes it possible to adjust to the required value of the frequency displacement at the output of the modulation circuit.

The modulation circuit comprises again two oscillators 1 and 2 which are oppositely controlled by varactor diodes, such circuit corresponding substantially to the circuit described in connection with FIG. 2. There is again provided a filter 18, a circular 19, and a mixing stage 4, followed by an amplifier 5, 6 and a member 20 for equalizing the running time (distortion corrector). For the further raising of the level of the intermediate frequency oscillations, there is additionally provided a wideband amplifier 31 which is connected with the output 7 of the modulation circuit. The parts 21, 22, 23 for the corrective frequency adjustment likewise correspond to identically referenced parts in FIG. 2. There is additionally provided, at the output of the discriminator 21, a filter 32, for example, in the form of a gating circuit, which filters out the pilot frequency of the generator 26, which is over a pilot receiver 33 extended to an indicator device 34. This makes it possible to recognize disturbances in the modulator circuit, since absence of the pilot indication at the instrument 34 clearly shows that a disturbance must be present at a point between the input terminal 24 and the output terminal 7. The pilot oscillation also appears in the terminal stations and, in the case of through connection of the fundamental band, also at intermediate stations which follow the sending station in given spacings, so that it is possible to supervise with the aid of the pilot oscillation, practically the entire transmission path.

The output 7 of the modulation circuit is for the transformation into the microwave range connected with a frequency transformation device which places the intermediate frequency oscillations directly into the high radio frequency position. This has, particularly in connection with the described modulation circuit, the advantage, as compared with customary methods employing frequency multiplication of the intermediate frequency to obtain the required output frequency value, that the noise frequency displacement based upon thermal phase variations, remains small. The low noise level of the highly linear modulation circuit according to the invention can thus be particularly well preserved.

Changes may be made within the scope and spirit of the appended claims which define what is believed to be new and desired to have protected by Letters Patent.

We claim:

1. A modulation circuit for producing highly linear frequency modulated electromagnetic waves, comprising two oscillators, each having a frequency determining resonant circuit with inductance and capacitance, and a pair of oppositely poled varactor diodes connected in series circuit, with each of said series circuits connected in parallel with a respective one of the frequency determining resonant circuits thereof, for varying the frequency of the respective oscillator, a modulation signal connected to the common connecting points of the diodes of each series circuit, in opposite sense to one of said oscillators to the frequency variation of the other oscillator, the frequency of the respective oscillators being in the absence of modulation so different that the resulting frequency difference corresponds to a predetermined intermediate frequency value in the range of lower frequencies, means for establishing a frequency displacement for each of said oscillators which are different from one another, a mixing stage, a filter circuit, means for connecting the output of each oscillator with said mixing circuit, and means for connecting the output of said mixing circuit with said filter circuit for obtaining the oscillations with the difference frequency, the biasing of the varactor diodes of the two oscillators, and the different dimensioning of the ratio of inductance to capacitance of the two frequency determining resonance circuits, being so determined that the absolute frequency displacement of the respective oscillators is adjusted to compensate at the output of the mixing stage for distortions of even order.

2. A modulation circuit according to claim 1, wherein said series circuits are mutually identically poled, and means for connecting the modulation voltage source with both series circuits in opposite phase.

3. A modulation circuit according to claim 1, comprising a frequency control device operating with the frequency of the filter circuit, said device supplying a regulation voltage corresponding to the frequency delivered, and a frequency regulation device provided for one of said oscillators for correctively regulating the output frequency of the respective oscillator with the aid of said regulation voltage.

4. A modulation circuit according to claim 1, wherein one of said oscillators is relatively strongly coupled and the other of said oscillators is relatively weakly coupled with said mixing stage and further comprising a low pass filter for coupling the relatively weakly coupled oscillator with the mixing stage, the limit frequency of said low pass filter lying only slightly above the fundamental frequency of the corresponding oscillator.

5. A modulation circuit according to claim 1, wherein the coupling of the mixing stage to each of the respective oscillators is so selected for frequency dependence that the distortions of third order are for each oscillator reduced to a negligible value.

6. A modulation circuit according to claim 1, wherein the fundamental frequencies of the two oscillators are so selected that the frequencies thereof differ from any harmonics of the intermediate frequency at least by the modulation band width.

References Cited by the Examiner

UNITED STATES PATENTS

| | | | |
|---|---|---|---|
| 2,735,983 | 2/1956 | McLeod | 332—23 XR |
| 2,877,349 | 3/1959 | Bryden | 332—19 XR |
| 3,050,693 | 8/1962 | Sinninger. | |
| 3,109,993 | 11/1963 | Wargo | 331—177 XR |
| 3,188,615 | 6/1965 | Wilcox. | |
| 3,222,459 | 12/1965 | Drapkin | 332—30 |

HERMAN KARL SAALBACH, *Primary Examiner.*

A. L. BRODY, E. LIEBERMAN, P. L. GENSLER, *Assistant Examiners.*